United States Patent
Ho et al.

(10) Patent No.: US 7,520,939 B2
(45) Date of Patent: Apr. 21, 2009

(54) INTEGRATED BEVEL CLEAN CHAMBER

(75) Inventors: Henry Ho, San Jose, CA (US); Lily L. Pang, Fremont, CA (US); Anh N. Nguyen, Milpitas, CA (US); Alexander N. Lerner, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 650 days.

(21) Appl. No.: 10/826,492

(22) Filed: Apr. 16, 2004

(65) Prior Publication Data

US 2004/0206375 A1 Oct. 21, 2004

Related U.S. Application Data

(60) Provisional application No. 60/463,970, filed on Apr. 18, 2003.

(51) Int. Cl.
*B08B 3/00* (2006.01)
(52) U.S. Cl. ...................................................... 134/26
(58) Field of Classification Search .................... 134/26
See application file for complete search history.

(56) References Cited

U.S. PATENT DOCUMENTS

| | | | |
|---|---|---|---|
| 4,557,785 A | 12/1985 | Ohkuma | |
| 4,788,994 A * | 12/1988 | Shinbara | 134/157 |
| 5,022,419 A | 6/1991 | Thompson et al. | |
| 5,095,027 A | 3/1992 | Goldberg et al. | |
| 5,154,199 A | 10/1992 | Thompson et al. | |
| 5,221,360 A | 6/1993 | Thompson et al. | |
| 5,409,310 A | 4/1995 | Owczarz | |
| 5,820,685 A * | 10/1998 | Kurihara et al. | 118/729 |
| 5,851,041 A * | 12/1998 | Anderson et al. | 294/106 |
| 6,062,239 A | 5/2000 | Bexten | |
| 6,167,893 B1 | 1/2001 | Taatjes et al. | |
| 6,199,298 B1 | 3/2001 | Bergman | |
| 6,217,667 B1 | 4/2001 | Jolley | |
| 6,240,933 B1 | 6/2001 | Bergman | |
| 6,286,231 B1 | 9/2001 | Bergman et al. | |
| 6,309,981 B1 | 10/2001 | Mayer et al. | |
| 6,318,385 B1 | 11/2001 | Curtis et al. | |
| 6,319,841 B1 | 11/2001 | Bergman et al. | |

(Continued)

*Primary Examiner*—Michael Cleveland
*Assistant Examiner*—Samuel A Waldbaum
(74) *Attorney, Agent, or Firm*—Patterson & Sheridan

(57) ABSTRACT

A method and apparatus for cleaning the bevel of a semiconductor substrate. The apparatus generally includes a cell body having upstanding walls and a fluid drain basin, a rotatable vacuum chuck positioned centrally positioned in the fluid drain basin, and at least 3 substrate centering members positioned at equal radial increments around the rotatable vacuum chuck. The substrate centering members include a vertically oriented shaft having a longitudinal axis extending therethrough, a cap member positioned over an upper terminating end of the shaft, a raised central portion formed onto the cap member, the raised central portion having a maximum thickness at a location the coincides with the longitudinal axis, and a substrate centering post positioned on the cap member radially outward of the raised central portion, an upper terminating end of the substrate centering post extending from the cap member to a distance that exceeds the maximum thickness. The apparatus further includes a centering actuation mechanism in communication with the substrate centering posts, and a fluid dispensing arm pivotally connected to the cell body, the fluid dispensing arm being configured to dispense a processing fluid onto a first side of the substrate.

8 Claims, 8 Drawing Sheets

U.S. PATENT DOCUMENTS

| | | |
|---|---|---|
| 6,333,275 B1 | 12/2001 | Mayer et al. |
| 6,350,319 B1 | 2/2002 | Curtis et al. |
| 6,357,142 B1 | 3/2002 | Bergman et al. |
| 6,401,732 B2 | 6/2002 | Bergman |
| 6,413,436 B1 | 7/2002 | Aegerter et al. |
| 6,446,643 B2 | 9/2002 | Curtis et al. |
| 6,446,644 B1 | 9/2002 | Dolechek |
| 6,530,157 B1 * | 3/2003 | Henderson et al. ............ 33/644 |
| 6,537,416 B1 | 3/2003 | Mayer et al. |
| 6,550,484 B1 | 4/2003 | Gopinath et al. |
| 6,558,478 B1 | 5/2003 | Katakabe et al. |
| 6,615,854 B1 | 9/2003 | Hongo et al. |
| 2002/0026729 A1 | 3/2002 | Bergman et al. |
| 2002/0134512 A1 * | 9/2002 | Adachi et al. .......... 156/345.51 |

* cited by examiner

INTEGRATED BEVEL CLEAN CHAMBER

CROSS-REFERENCE TO RELATED APPLICATIONS

This application claims benefit of U.S. provisional patent application Ser. No. 60/463,970, filed Apr. 18, 2003, which is herein incorporated by reference.

BACKGROUND OF THE INVENTION

1. Field of the Invention

Embodiments of the invention generally relate to an apparatus and method for cleaning a bevel of a substrate after a semiconductor processing step has been conducted on the substrate.

2. Description of the Related Art

Metallization of sub-quarter micron sized features is a foundational technology for present and future generations of integrated circuit manufacturing processes. More particularly, in devices such as ultra large scale integration-type devices, i.e., devices having integrated circuits with more than a million logic gates, the multilevel interconnects that lie at the heart of these devices are generally formed by filling high aspect ratio, i.e., greater than about 15:1, interconnect features with a conductive material, such as copper. Conventionally, deposition techniques such as chemical vapor deposition (CVD) and physical vapor deposition (PVD) have been used to fill these interconnect features. However, as the interconnect sizes decrease and aspect ratios increase, void-free interconnect feature fill via conventional metallization techniques becomes increasingly difficult. Therefore, plating techniques, i.e., electrochemical plating (ECP) and electroless plating, have emerged as promising processes for void free filling of sub-quarter micron sized high aspect ratio interconnect features in integrated circuit manufacturing processes.

In an ECP process, for example, sub-quarter micron sized high aspect ratio features formed into the surface of a substrate (or a layer deposited thereon) may be efficiently filled with a conductive material. ECP plating processes are generally two stage processes, wherein a seed layer is first formed over the surface features of the substrate (generally through PVD, CVD, or other deposition process in a separate tool), and then the surface features of the substrate are exposed to an electrolyte solution (in the ECP tool), while an electrical bias is applied between the seed layer and a copper anode positioned within the electrolyte solution. The electrolyte solution generally contains ions to be plated onto the surface of the substrate, and therefore, the application of the electrical bias causes these ions to be plated onto the biased seed layer, thus depositing a layer of the ions on the substrate surface that may fill the features.

Once the plating process is completed, the substrate is generally transferred to at least one of a substrate rinsing cell or a bevel edge clean cell. Bevel edge clean cells are generally configured to dispense an etchant onto the perimeter or bevel of the substrate to remove unwanted metal plated thereon. The substrate rinse cells, often called spin rinse dry cells, generally operate to rinse the surface of the substrate (both front and/or back) with a rinsing solution to remove any contaminants and/or residual chemicals therefrom. Further, the rinse cells are often configured to spin the substrate at a high rate of speed in order to spin off any remaining rinsing fluid droplets adhering to the substrate surface after the rinsing process is complete. Once the remaining fluid droplets are spun off, the substrate is generally clean and dry, and therefore, ready for transfer from the ECP tool to another tool, such as a chemical mechanical polishing tool for subsequent processes.

However, conventional bevel clean chambers or cells present several challenges and/or disadvantages. For example, conventional bevel cleaning cells have been prone to etchant "splash back", which is generally defined as when chemicals used in the removal process (which are generally very acidic) splash or are otherwise caused to return to the production surface of the substrate. Splash back can occur from the physical deflection of fluid from the substrate surface upon application of the fluid to the substrate surface (generally in the bevel region), or alternatively splash back may be caused be the airflow generated by the rotation of the substrate not being adequately controlled and reversing flow direction toward the substrate center.

Further, conventional bevel clean chambers and cells have difficulty accurately centering substrates for processing without bowing or even breaking the substrate. This is critical to advancement of plating processes not only for reduction in substrate breakage, but also for accuracy of chemical application. As circuit densities increase, maximization of the available surface area on the substrate becomes important. Improper or inaccurate substrate centering before application of a bevel cleaning solution can substantially limit the available surface area.

Therefore, there is a need for an improved bevel clean chamber capable of minimal splash back and accurate centering.

SUMMARY OF THE INVENTION

Embodiments of the invention generally provide a bevel clean cell for an ECP platform. The bevel clean cell generally includes a first rotatable substrate support member centrally located in a lower portion of the bevel clean cell and a second fixed substrate support and centering assembly located radially outward of the centrally positioned substrate support member. A plurality of fluid dispensing nozzles are positioned to dispense etching and/or rinsing solutions onto the front and backside of a substrate positioned in the bevel clean cell. At least one of the fluid dispensing nozzles is positioned to dispense an edge bead removal solution onto a bevel edge and exclusion zone portion of a substrate positioned on the substrate support member.

Embodiments of the invention further provide an apparatus for cleaning the bevel of a semiconductor substrate. The apparatus generally includes a cell body having upstanding walls and a fluid drain basin, a rotatable vacuum chuck positioned centrally positioned in the fluid drain basin, and at least three substrate centering members positioned at equal radial increments around the rotatable vacuum chuck. The substrate centering members include a vertically oriented shaft having a longitudinal axis extending therethrough, a cap member positioned over an upper terminating end of the shaft, a raised central portion formed onto the cap member, the raised central portion having a maximum thickness at a location that coincides with the longitudinal axis, and a substrate centering post positioned on the cap member radially outward of the raised central portion, an upper terminating end of the substrate centering post extending from the cap member to a distance that exceeds the maximum thickness. The apparatus further includes a centering actuation mechanism in communication with the substrate centering posts, and a fluid dispensing arm pivotally connected to the cell body, the fluid dispensing arm being configured to dispense a processing fluid onto a first side of the substrate.

Embodiments of the invention further provide a substrate cleaning chamber. The chamber includes a chamber body, a rotatable substrate support member positioned in a lower portion of the chamber body, at least three cooperatively rotatable substrate centering posts radially positioned around the rotatable substrate support member, a pivotally mounted fluid dispensing nozzle positioned in communication with the chamber body and being configured to dispense a cleaning fluid onto a particular radial location of a top surface of a substrate positioned on the substrate support member, and a backside fluid dispensing nozzle positioned in the lower portion of the chamber body.

Embodiments of the invention further provide a substrate cleaning cell having a vacuum chuck positioned in a chamber body, a plurality of rotatable substrate centering posts positioned radially around the vacuum chuck, and an actuator mechanism in communication with the substrate centering posts, the actuator mechanism being configured to simultaneously rotate the substrate centering posts. The cell may further include a pivotally mounted fluid dispensing arm positioned on the chamber body and being configured to dispense a first processing fluid onto a first side of a substrate positioned on the vacuum chuck, and a fluid dispensing nozzle positioned adjacent the vacuum chuck, the fluid dispensing nozzle being configured to dispense a second processing fluid onto a second side of the substrate, the second side being opposite of the first side.

Embodiments of the invention further provide a method for cleaning a bevel of a substrate. The method includes positioning a substrate on a raised central portion of a plurality of substrate support posts while the substrate support posts are in a loading position, and cooperatively rotating the substrate support posts to engage the bevel of the substrate with a corresponding plurality of substrate centering posts, the substrate centering posts being positioned radially outward of the central portion. The method further includes lowering the substrate support posts to a processing position, engaging a backside of the substrate with a vacuum chuck and lifting the substrate off of the substrate support posts, and rotating the substrate on the vacuum chuck while dispensing a first processing fluid onto the bevel of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide a multi-chemistry electrochemical plating system configured to plate conductive materials onto semiconductor substrates. The plating system generally includes a substrate loading area in communication with a substrate processing platform. The loading area is generally configured to receive substrate containing cassettes and transfer substrates received from the cassettes into the plating system for processing. The loading area generally includes a robot configured to transfer substrates to and from the cassettes and to the processing platform or a substrate annealing chamber positioned in communication with the loading area. The processing platform generally includes at least one substrate transfer robot and a plurality of substrate processing cells, i.e., ECP cells, bevel clean cells, spin rinse dry cells, substrate cleaning cells, and electroless plating cells.

Figure 1:
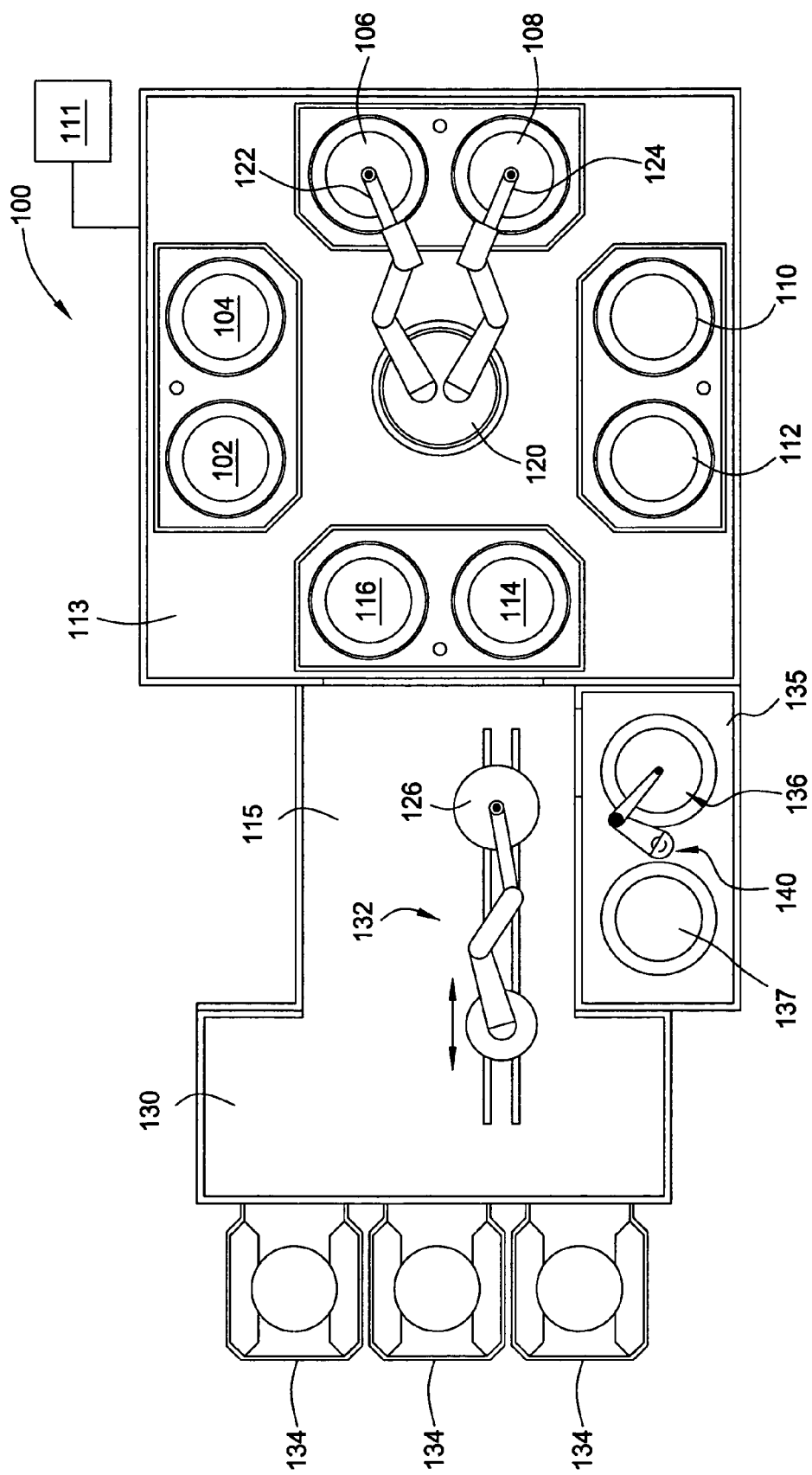
FIG. 1 is a top plan view of one embodiment of an electrochemical plating system of the invention.

FIG. 1 illustrates a top plan view of an ECP system 100 of the invention. ECP system 100 includes a factory interface (FI) 130, which is also generally termed a substrate loading station. Factory interface 130 includes a plurality of substrate loading stations configured to interface with substrate containing cassettes 134. A robot 132 is positioned in factory interface 130 and is configured to access substrates contained in the cassettes 134. Further, robot 132 also extends into a link tunnel 115 that connects factory interface 130 to processing mainframe or platform 113. The position of robot 132 allows the robot to access substrate cassettes 134 to retrieve substrates therefrom and then deliver the substrates to one of the processing cells 114, 116 positioned on the mainframe 113, or alternatively, to the annealing station 135. Similarly, robot 132 may be used to retrieve substrates from the processing cells 114, 116 or the annealing chamber 135 after a substrate processing sequence is complete. In this situation robot 132 may deliver, the substrate back to one of the cassettes 134 for removal from system 100.

The anneal chamber 135 generally includes a two position annealing chamber, wherein a cooling plate/position 136 and a heating plate/position 137 are positioned adjacently with a substrate transfer robot 140 positioned proximate thereto, e.g., between the two stations. The robot 140 is generally configured to move substrates between the respective heating 137 and cooling plates 136. Further, although the anneal chamber 135 is illustrated as being positioned such that it is accessed from the link tunnel 115, embodiments of the invention are not limited to any particular configuration or placement. As such, the anneal chamber may be positioned in communication with the mainframe 113. Additional information relative to the anneal chamber of the invention may be found in a commonly assigned U.S. patent application entitled "Two Position Anneal Chamber" naming Edwin Mok and Son Nguyen as inventors (Ser. No. unavailable at the time of filing), which is hereby incorporated by reference in its entirety.

As mentioned above, ECP system 100 also includes a processing mainframe 113 having a substrate transfer robot 120 centrally positioned thereon. Robot 120 generally includes one or more arms/blades 122, 124 configured to support and transfer substrates thereon. Additionally, the robot 120 and the accompanying blades 122, 124 are generally configured to extend, rotate, and vertically move so that the robot 120 may insert and remove substrates to and from a plurality of processing locations 102, 104, 106, 108, 110, 112, 114, 116 positioned on the mainframe 113. Similarly, factory interface robot 132 also includes the ability to rotate, extend, and vertically move its substrate support blade, while also allowing for linear travel along the robot track that extends from the factory interface 130 to the mainframe 113. Generally, process locations 102, 104, 106, 108, 110, 112, 114, 116 may be any number of processing cells utilized in an electrochemical plating platform. More particularly, the process locations may be configured as electrochemical plating cells, rinsing cells, bevel clean cells, spin rinse dry cells, substrate surface cleaning cells, electroless plating cells, metrology inspection stations, and/or other processing cells that may be beneficially used in conjunction with a plating platform. Each of the respective processing cells and robots are generally in communication with a process controller 111, which may be a microprocessor-based control system configured to receive inputs from both a user and/or various sensors positioned on the system 100 and appropriately control the operation of system 100 in accordance with the inputs.

In the exemplary plating system illustrated in FIG. 1, the processing locations may be configured as follows. Processing locations 114 and 116 may be configured as an interface between the wet processing stations on the mainframe 113 and the dry processing regions in the link tunnel 115, annealing chamber 135, and the factory interface 130. The processing cells located at the interface locations may be spin rinse dry cells and/or substrate cleaning cells. More particularly, each of locations 114 and 116 may include both a spin rinse dry cell and a substrate cleaning cell in a stacked configuration. Locations 102, 104, 110, and 112 may be configured as plating cells, either electrochemical plating cells or electroless plating cells, for example. Locations 106, 108 may be configured as substrate bevel cleaning cells. Additional configurations and implementations of an electrochemical processing system are illustrated in commonly assigned U.S. patent application Ser. No. 10/435,121 filed on Dec. 19, 2002 entitled "Multi-Chemistry Electrochemical Processing System", which is incorporated herein by reference in its entirety.

Figure 2:
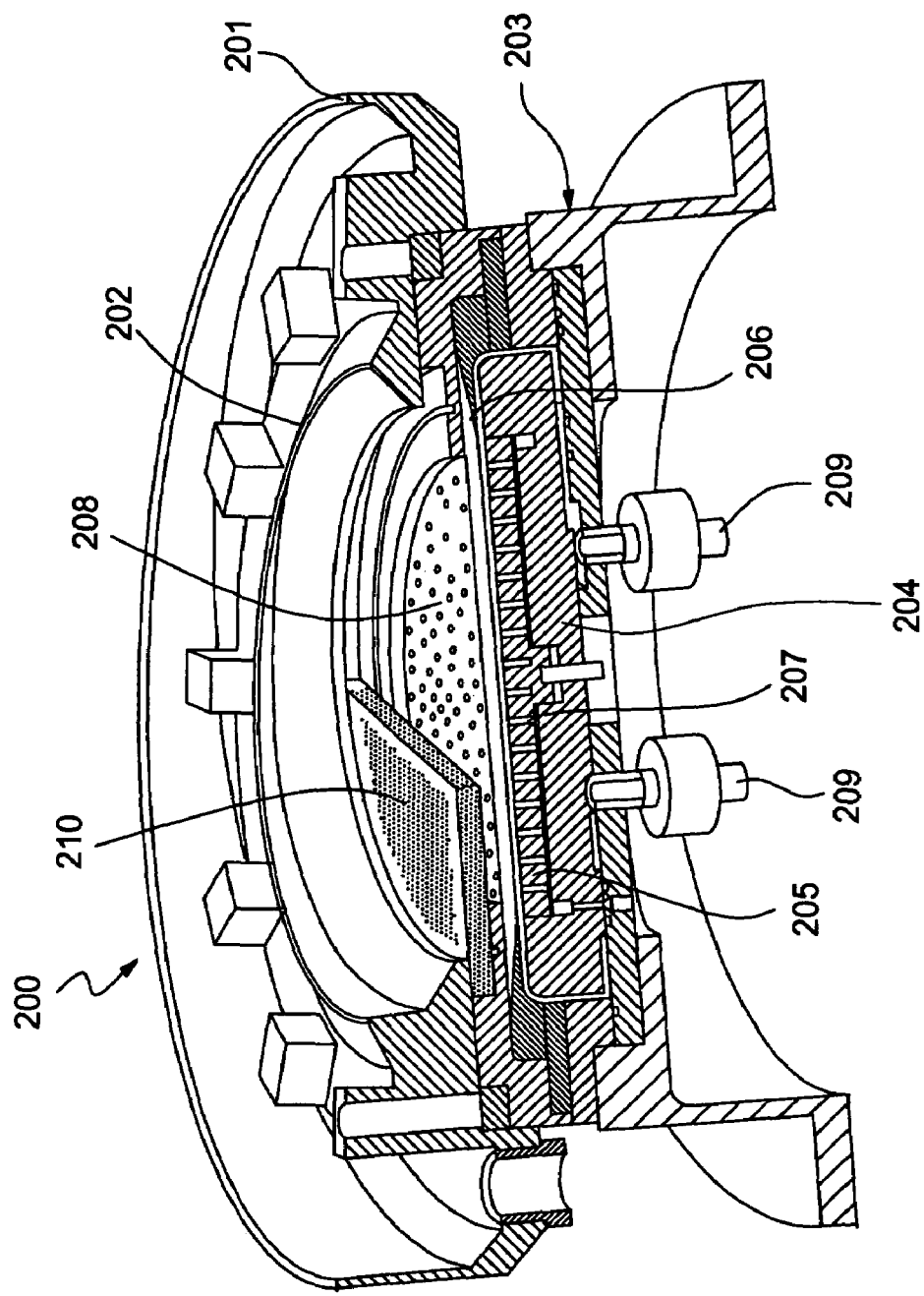
FIG. 2 illustrates an exemplary embodiment of a plating cell used in the electrochemical plating cell of the invention.

FIG. 2 illustrates a partial perspective and sectional view of an exemplary plating cell 200 that may be implemented in processing locations 102, 104, 110, and 112. The electrochemical plating cell 200 generally includes an outer basin 201 and an inner basin 202 positioned within outer basin 201. Inner basin 202 is generally configured to contain a plating solution that is used to plate a metal, e.g., copper, onto a substrate during an electrochemical plating process. During the plating process, the plating solution is generally continuously supplied to inner basin 202 (at about 1 gallon per minute for a 10 liter plating cell, for example), and therefore, the plating solution continually overflows the uppermost point, (generally termed a "weir") of inner basin 202 and is collected by outer basin 201 and drained therefrom for chemical management and recirculation. Plating cell 200 is generally positioned at a tilt angle, i.e., the frame portion 203 of plating cell 200 is generally elevated on one side such that the components of plating cell 200 are tilted between about 3° and about 30°, or generally between about 4° and about 10° for optimal results. The frame member 203 of plating cell 200 supports an annular base member on an upper portion thereof. Since frame member 203 is elevated on one side, the upper surface of base member 204 is generally tilted from the horizontal at an angle that corresponds to the angle of frame member 203 relative to a horizontal position. Base member 204 includes an annular or disk shaped recess formed into a central portion thereof, the annular recess being configured to receive a disk shaped anode member 205. Base member 204 further includes a plurality of fluid inlets/drains 209 extending from a lower surface thereof. Each of the fluid inlets/drains 209 are generally configured to individually supply or drain a fluid to or from either the anode compartment or the cathode compartment of plating cell 200. Anode member 205 generally includes a plurality of slots 207 formed therethrough, wherein the slots 207 are generally positioned in parallel orientation with each other across the surface of the anode 205. The parallel orientation allows for dense fluids generated at the anode surface to flow downwardly across the anode surface and into one of the slots 207.

Plating cell 200 further includes a membrane support assembly 206. Membrane support assembly 206 is generally secured at an outer periphery thereof to base member 204, and includes an interior region configured to allow fluids to pass therethrough. A membrane 208 is stretched across the support 206 and operates to fluidly separate a catholyte chamber and anolyte chamber portions of the plating cell. The membrane support assembly may include an o-ring type seal positioned near a perimeter of the membrane, wherein the seal is configured to prevent fluids from traveling from one side of the membrane secured on the membrane support 206 to the other side of the membrane. A diffusion plate 210, which is generally a porous ceramic disk member is configured to generate a substantially laminar flow or even flow of fluid in the direction of the substrate being plated, is positioned in the cell between membrane 208 and the substrate being plated. The exemplary plating cell is further illustrated in commonly assigned U.S. patent application Ser. No. 10/268,284, which was filed on Oct. 9, 2002 under the title "Electrochemical Processing Cell", claiming priority to U.S. Provisional Application Serial No. 60/398,345, which was filed on Jul. 24, 2002, both of which are incorporated herein by reference in their entireties.

Figure 3:
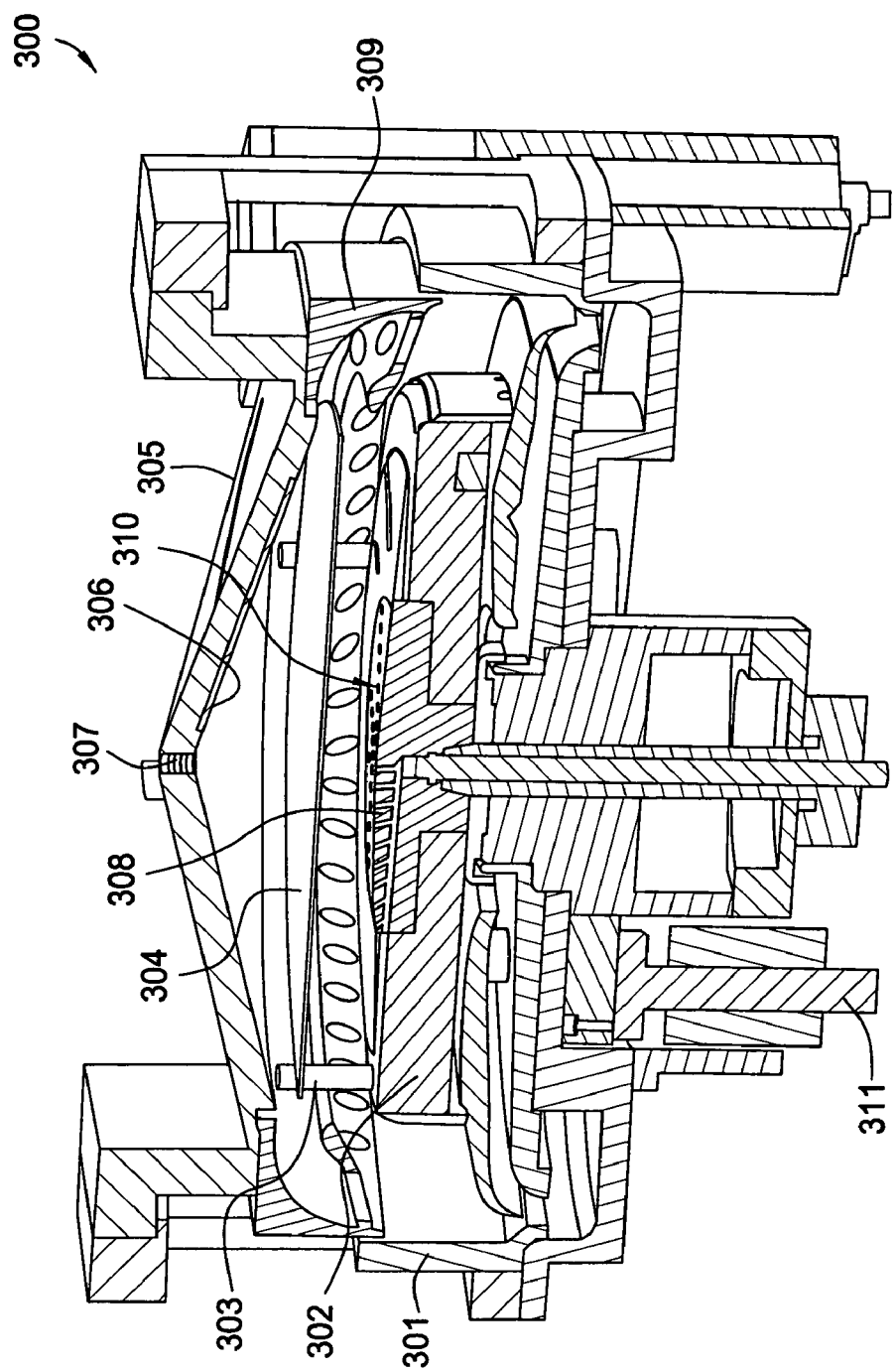
FIG. 3 illustrates a partial perspective and sectional view of an exemplary substrate spin rinse dry cell of the invention.

FIG. 3 illustrates a partial perspective and sectional view of an exemplary substrate spin rinse dry cell 300 of the invention. The spin rinse dry cell 300 (SRD) includes a fluid bowl/body 301 supported on a frame that may be attached to a plating system, such as the mainframe 113 illustrated in FIG. 1. The SRD 300 further includes a rotatable hub 302 centrally positioned in the fluid bowl 301. Hub 302 includes a generally planar upper surface that has a plurality of backside fluid dispensing nozzles 308 formed thereon and at least one gas dispensing nozzle 310 formed thereon. A plurality of upstanding substrate support fingers 303 are positioned radially around the perimeter of hub 302. Fingers 303 are configured to rotatably support a substrate 304 at the bevel edge thereof for processing in SRD 300. The upper portion of SRD 300 may optionally include a lid member 305 and at least one gas nozzle 307, and a fluid dispensing manifold 306. In embodiments where the lid member 305 is not included, cell 300 may include one or more fluid dispensing arms (not shown), in similar fashion to fluid dispensing arms 405 and 406 of the bevel clean cell described herein. Cell 300 may further include a flow directing member 315 that is essentially an annular member extending inwardly from body portion 301 toward the perimeter of the substrate. The terminating end of member 315 is generally positioned above the upper surface of the substrate, and the portion of member 315 that extends from the terminating end toward the body 301 is generally angled downward such that the base of member 315 is positioned below the upper surface of the substrate. The configuration of the flow directing member provides for improved air flow over the perimeter of the substrate and minimizes backsplash, as described in commonly assigned U.S. patent application Ser. No. 10/680,616, filed on Oct. 6, 2003, entitled "Spin Rinse Dry Cell", which is hereby incorporated by reference in its entirety.

Figure 4:
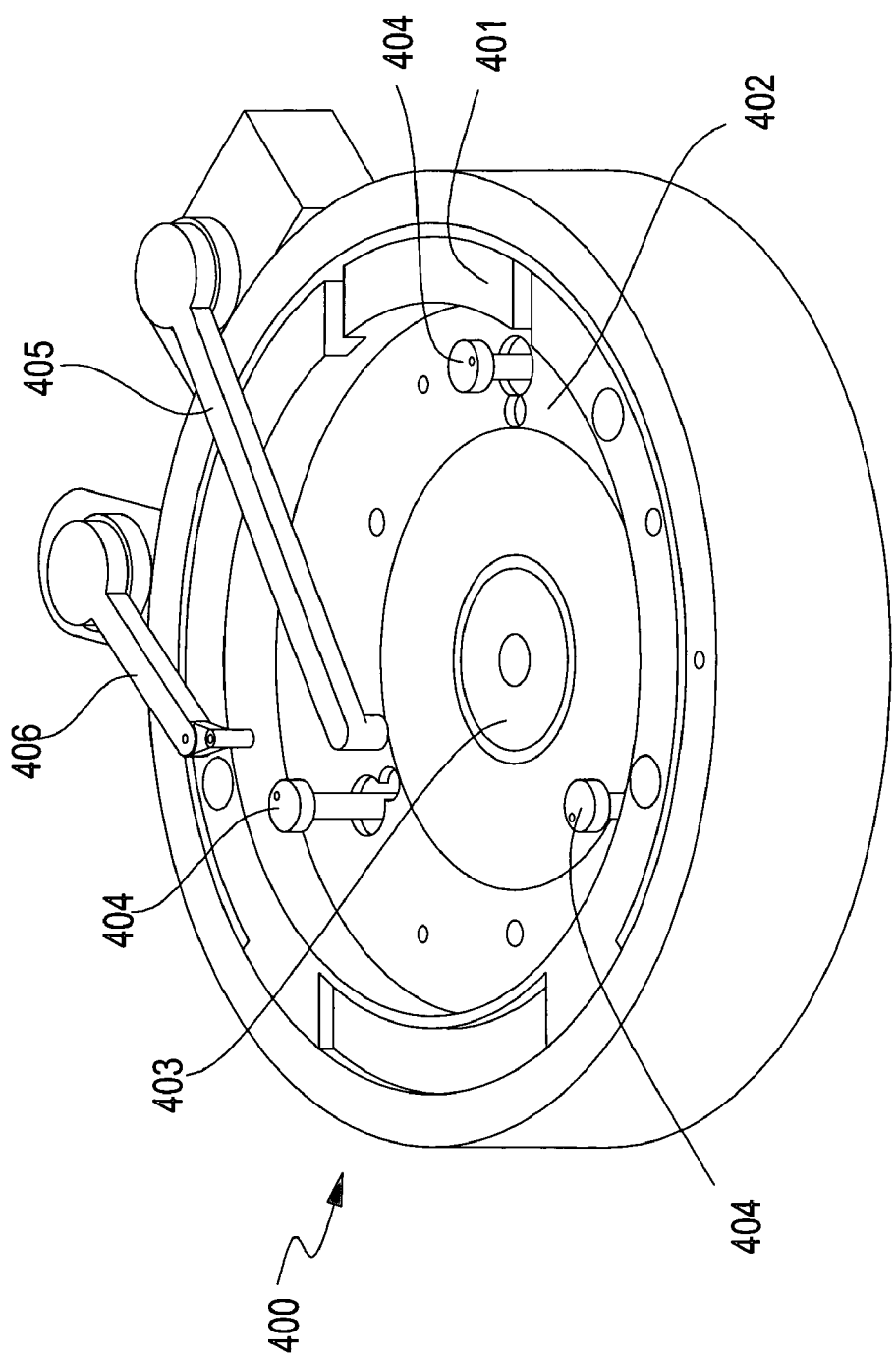
FIG. 4 illustrates a top perspective view of an exemplary bevel clean cell of the invention.

FIG. 4 illustrates a top perspective view of an exemplary bevel clean cell or chamber 400 of the invention. As noted above, bevel clean cell 400 may be positioned at any one of the processing locations 102, 104, 106, 108, 110, 112, 114, and 116, indicated on system 100. However, in the present exemplary embodiment of the invention, bevel clean cells 400 are generally positioned at processing locations 106 and 108. FIG. 4 is a top perspective view of the exemplary bevel clean cell 400, and FIG. 4 generally illustrates the upper components of the exemplary bevel clean cell 400. These components generally include a cell bowl or chamber having an upstanding wall portion 401 and drain basin 402 in communication with the lower portion of wall 401. The cell bowl is generally manufactured from a plastic material, a nylon-type material, or metal material coated with a non metal. The material is generally selected to be non reactive with semiconductor processing etchant solutions. Drain basin 402 is generally configured to receive a processing fluid thereon, and channel the processing fluid to a fluid drain (not shown).

A central portion of basin 402 includes a substrate chuck 403. The substrate chuck 403, which generally may be any type of substrate chuck used in semiconductor processing, is configured to be rotatable and/or vertically actuatable. More particularly, substrate chuck 403 may be a vacuum chuck having at least one vacuum aperture formed into the upper surface thereof, wherein the vacuum aperture is selectively in fluid communication with a vacuum source, such that the vacuum source and vacuum aperture may cooperatively operate to secure a substrate to substrate chuck 403 via application of negative pressure to a volume between the substrate and the chuck 403. Substrate chuck 403 is generally supported by a mechanical mechanism positioned below drain basin 402, wherein the mechanical mechanism is configured to impart both rotational movement to chuck 403, as well as optional vertical movement to chuck 403, i.e., the mechanical mechanism is configured to optionally raise and lower chuck 403 to engage and disengage substrates positioned on the substrate centering pins 404, as will be further discussed herein. Further, the drain basin 402 may include a shield or cover positioned over the surface of the basin, wherein the shield or cover includes apertures formed therein for components that extend upward therethrough.

The upper portion of wall 401 may include a curved flow directing member that is not shown in FIG. 4, however, the flow directing member may be similar to the flow directing member 315 of the SRD illustrated in FIG. 3. The flow directing member 315 generally operates to generate an outward and downward air flow around the perimeter of the substrate when the substrate is rotated, which operates to prevent backsplash or misting of the substrate surface by the processing fluids, as these fluids are generally acidic and known to cause defects in plated layers. More particularly, when rotating, the substrate essentially acts like a pump pushing air outward across the surface of the substrate in the direction of the wall. In conventional cells, a region of high pressure developed near the perimeter of the cell, which caused the airflow to reverse and flow upward and back over the substrate surface. The curved flow directing member 315 channels the air flow into a region of low pressure generated by a vacuum pump, for example, and thus, eliminates the high pressure region and the backsplash associated therewith. Without the downwardly curving surface of the wall, the outward airflow is allowed to travel upward when it hits the wall reverse direction toward the center of the substrate. This reverse flow carries the fluid suspended in the airflow back over the surface of the substrate. Thus the curved wall is configured to channel the outwardly moving airflow downward into an area of reduced pressure for capture without reversing direction or traveling back over the surface of the substrate. The outer extending point of the flow directing member is generally positioned slightly above the upper surface of a substrate in a processing position.

Drain basin 402 also includes a plurality of substrate centering pins 404 extending upward therefrom. Centering pins 404 are generally positioned radially around the perimeter of drain basin/shield 402 in an equal spacing arrangement, for example. However, the pins 404 may be positioned in any desired spacing arrangement. For example, in the embodiment illustrated in FIG. 4, three substrate centering pins 404 are positioned around the perimeter of drain basin 402 at 120°increments; however, the pins 404 may be positioned at 20°, 180°, and 340°, for example. The substrate centering pins 404 are generally supported by a substrate centering mechanism positioned below basin 402, which will be further discussed herein, that is configured to both vertically actuate pins 404 and rotationally actuate pins 404 about a longitudinal axis of pins 404, which generally corresponds with the rotational center of pins 404. Bevel clean cell 400 further includes at least one rinsing solution dispensing arm 405, along with at least one etching solution dispensing arm 406. Generally, both arms 405 and 406 are pivotally mounted to a perimeter portion of bevel clean cell 400, and include a longitudinally extending arm having at least one fluid dispensing nozzle positioned on a distal terminating end thereof. The nozzles are positioned to dispense the respective processing fluids onto a first or upper side of a substrate positioned on the support member 403. More particularly, when the processing cell 400 is configured as a face-up processing cell, i.e., when substrates are positioned in the cell with the production surface facing away from basin 402, then the fluid dispensing nozzles are configured to dispense their respective fluids onto the production surface of the substrate.

The operation of arms 405 and 406 is generally controlled the by a system controller, which is configured to precisely position (via pivotal actuation and/or vertical actuation of the respective arms) the distal end of the respective arms over a specified radial position of a substrate being processed, which allows for fluid dispensed from the nozzles positioned at the respective ends of the arms to be dispensed onto precise radial locations of a substrate being processed in bevel clean cell 400. Additionally, although two arms are illustrated in the present exemplary embodiment for separately dispensing the rinsing solution, which may be deionized water, and the etching solution, which may be an acid, embodiments of the invention are not intended to be limited to any particular number of fluid dispensing arms. More particularly, other embodiments of the invention may implement a single pivotally amounted to arm having both rinsing solution dispensing nozzles and etchant solution dispensing nozzles positioned to thereon. In this configuration, however, the placement of the respective rinsing solution nozzles and the etching solution nozzles becomes more important, as bevel clean processes generally require precise dispensing of the etchant solution onto the exclusion zone of the substrate being processed, i.e., onto the outer 2-5 mm perimeter of the substrate. Further, each of arms 405 and 406 may include a mechanism configured to prevent fluid dripping from the nozzles when the nozzles are not activated from touching the substrate. For example, the nozzles may include a vacuum port or suck up valve (not shown) that is configured to receive unwanted fluid drips during off times. Alternatively, nozzles may include a gas aperture that is configured to blow unwanted droplets of fluid away from the substrate surface.

Figure 5:
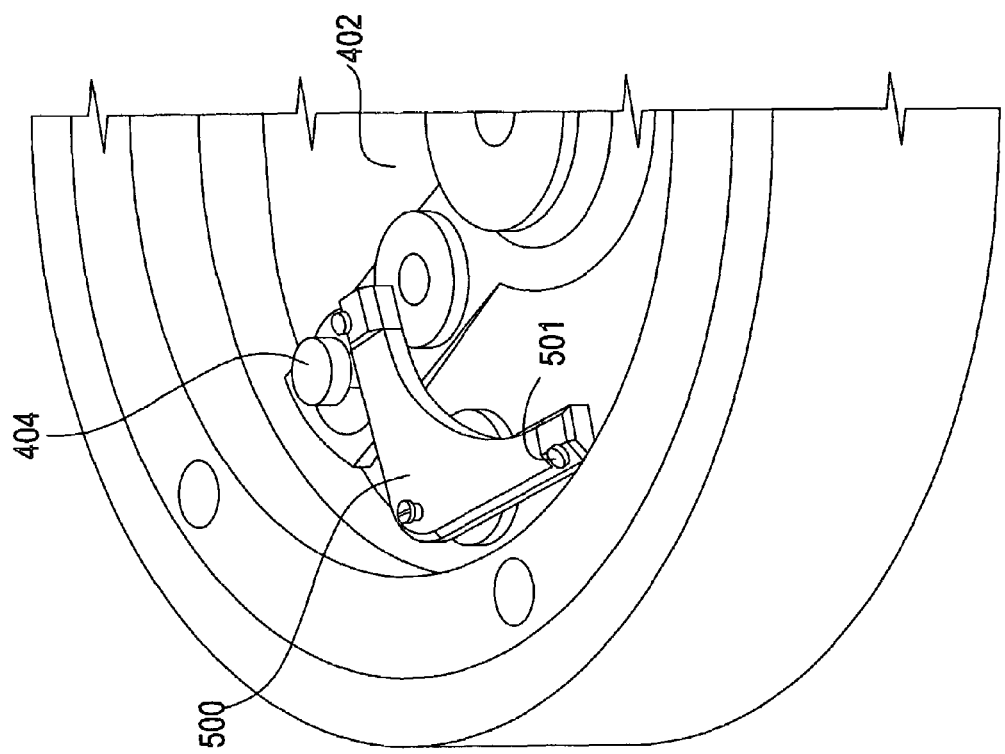
FIG. 5 illustrates a top perspective view of an exemplary backside fluid dispensing manifold for the bevel clean cell of the invention.

FIG. 5 illustrates a top perspective view of an exemplary backside fluid dispensing manifold 500 of the invention. The backside fluid dispensing manifold 500 is generally positioned on the fluid drain basin 402 between substrate centering pins 404. Manifold 500 generally includes a V-shaped structure having 2 distal terminating ends. Each of the respective ends includes a fluid dispensing nozzle 501 positioned to thereon. Manifold 500 may be vertically actuated and pivotally actuated to particularly position the respective fluid dispensing nozzles 501 with respect to the substrate being processed the cell 400. This configuration allows for the pivotally mounted fluid dispensing arms 405 and 406 to dispense processing fluids onto the production or front side of the substrate, while manifold of 500 may simultaneously dispense processing fluids onto the nonproduction or backside of the substrate.

Figure 6:
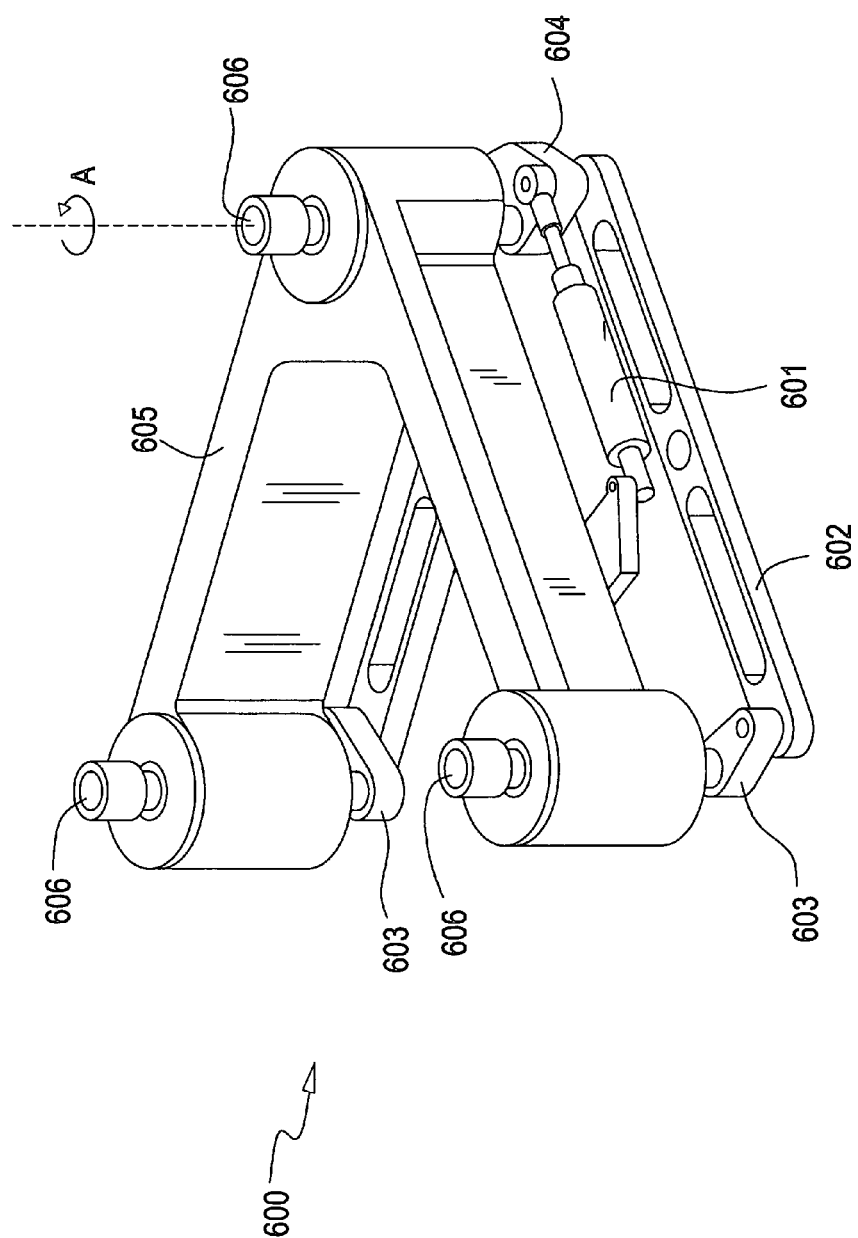
FIG. 6 illustrates a perspective view of an exemplary substrate centering mechanism of the invention.

FIG. 6 illustrates a perspective view of an exemplary substrate centering mechanism 600 of the invention. The centering mechanism 600 is generally positioned below basin 402, and includes a frame member 605 having a plurality of receptacles 606 configured to receive and secure the substrate centering pins 404 therein. Frame 605 may be in communication with an actuation mechanism configured to move the frame member 605 and the associated components, i.e., to raise and lower the frame member 605. In the illustrated exemplary embodiment, frame 605 includes three receptacles. 606 configured to receive the substrate centering pins 404. A lower portion of each of receptacles 606 extends through frame member 605 out the opposing side, as illustrated in FIG. 6. Further, each of receptacles 606 are rotatably mounted within frame 605, such that the receptacles 606 may be rotated in the direction indicated by arrow "A" above the receptacles, and as such, cause the substrate centering pins 404 secured in the receptacles to also rotate. With the lower portion of each of the receptacles 606 that extends below frame 605 generally includes an actuation arm or eccentric cam member 603, 604 attached thereto. Each of the actuation arms 603, 604 are also connected to another one of the actuation arms 603 via connection member or linkage 602, which may be a solid linkage, belt, hydraulic member, etc. Further, a selectively activated actuation device 601 is mechanically in communication with a primary arm member 604, and is configured to selectively impart pivotal movement thereto.

Since each of the receptacles 606 are rotatably mounted within their respective portions of frame member 605, and since each of the lower extending portions of receptacles 606 include an actuator 603 and linkage 602 attached thereto, actuation of the primary arm member 604 by actuator 601 causes pivotal movement to actuator arm 604, directly causes the other arms 603 and corresponding receptacles 606 to correspondingly pivot with the primary arm 604. More particularly, each receptacle 606 receives a substrate centering pan 404, and when actuator 601 pivots via primary arm 604, the corresponding receptacles 606 above arms 604 are also pivoted. Further, since linkage 602 connects the secondary pivot arms 603 to the primary pivot arms 604, pivotal movement of the primary pivot arm 604 translates to a corresponding pivotal movement to the secondary pivot arm 603, which directly results in pivotal or rotational movement of the receptacles 606 positioned above the secondary arms 603. This configuration allows for each of the substrate centering pins to be rotatably actuated simultaneously, and for the actuation/rotation to be identical between the three substrate centering pins. Further, each of the receptacles 606 may be vertically actuated, via, for example, vertical movement of the entire centering mechanism 600, or alternatively, via vertical slidable movement of the receptacles 606 within frame 605.

Actuator 601 is generally an actuator configured to rotate the substrate centering posts 404 to engage and center a substrate between the respective posts without exerting excessive pressure on the substrate. For example, each of the posts 404 includes a centering pin that operates to engage and slide the substrate to a centered position, as will be further discussed herein. Once the substrate is slidably positioned at the center location, the centering pins continue to mechanically engage the substrate to maintain the substrate in the centered position. However, in conventional centering mechanisms, the strength and configuration of the actuator caused the substrate to bow as a result of the forces being applied to the perimeter of the substrate by the centering posts once the substrate was centered. Further, once the substrate bowed, even if the actuator were released, the lack of biasing pressure against the substrate by the actuator causes the substrate to shift from center. Therefore, to address this problem, the inventors have replaced the conventional actuator 601 with a frictionless actuator. The frictionless actuator 601 operates similarly to conventional actuators during the centering process, however, once the substrate is centered, the frictionless actuator overcomes the bowing and shifting off center challenges associated with conventional actuators. For example, once the substrate is centered, frictionless actuators can be released without movement or a substantial change in drive pressure of the actuator. Further, frictionless actuators are capable of centering the substrate without squeezing the substrate to the point of bowing. Airpot Corporation of Norwalk, Conn. manufactures instrument quality pneumatic actuators and Airpel Anti-Stiction Air Cylinders, for example, may be used to advantage as actuator 601. These devices are generally manufactured using a graphite piston and borosilicate glass cylinder combination in which each piston is selectively matched to fit the cylinder with extremely close tolerances. This configuration provides low friction between the cylinder and piston, and therefore the actuator is responsive to forces as low as only a few grams and actuation pressures of less than 0.2 psi. Further, the starting and running friction are nearly identical, which prevents uneven or uncontrolled starts and provides uniform smoothness throughout the full stroke of the device. As such, using the frictionless-type actuator, once the substrate is centered, the frictionless actuator may be released without encountering reverse movement or slipping of the substrate. Alternatives to the frictionless actuator include motors, voice coils, electro-ceramics, etc.

Figure 7A:
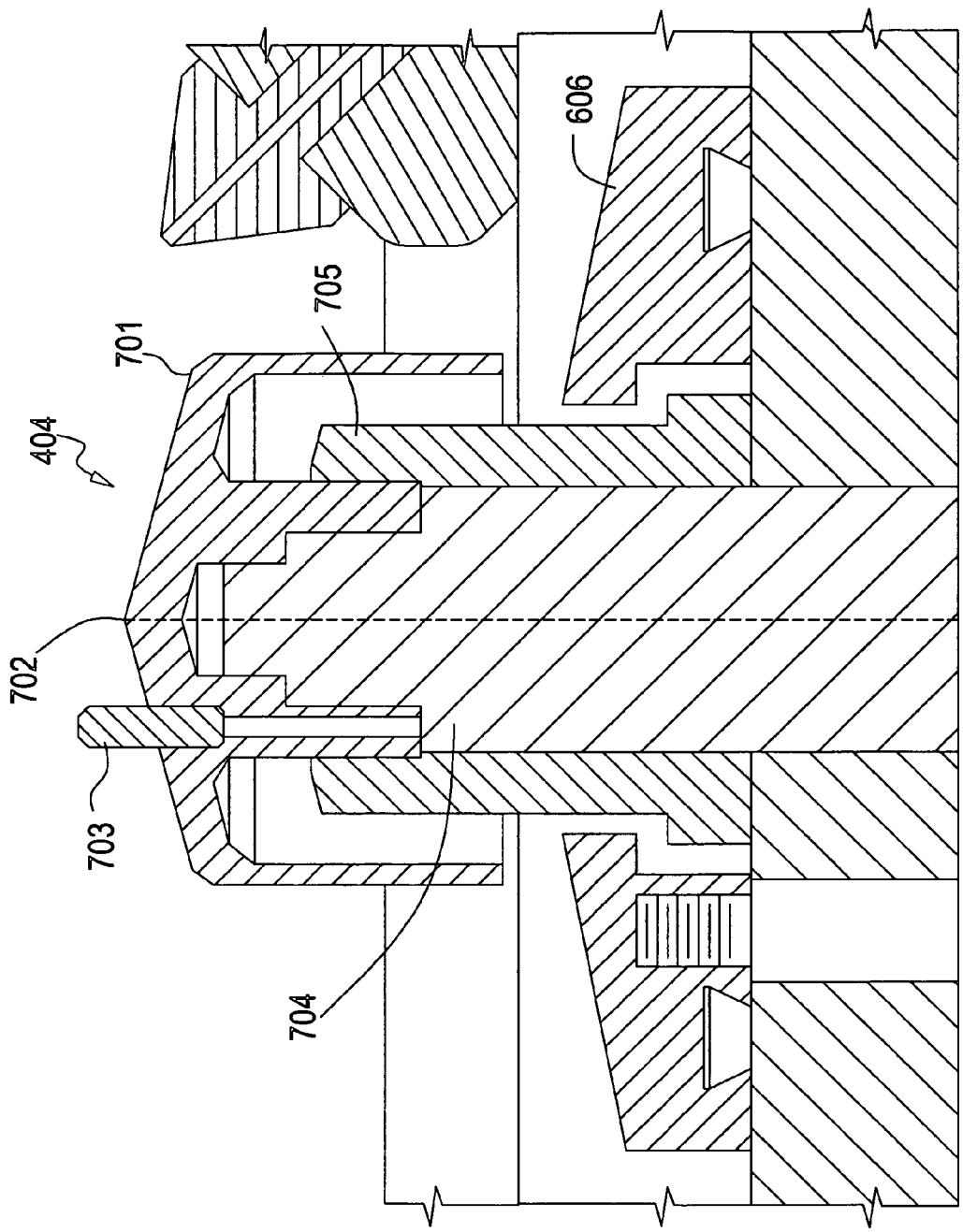
FIG. 7A illustrates a sectional view of an exemplary substrate centering member of the invention.

FIG. 7A illustrates a sectional view of an exemplary substrate centering member or post 404 of the invention. The centering post 404 is generally elongated, i.e., cylindrically shaped, and is configured to be received in receptacles 606 of the substrate centering mechanism 600. Posts 404 generally include a core 704 that has a cap-member 701 that covers the upper portion of the core 704. The core 704 is generally manufactured from a rigid material, such as a ceramic, for example. The cap member 701 includes a raised central portion 702 that terminates in a peak or central point. The peak or point of central portion 702 is positioned such that it coincides with the longitudinal axis of the post 404, such that when post 404 is rotated, the point or peak of central portion 702 remains in a unitary location. Cap member 701 is generally manufactured from a rigid material that has good exposure characteristics to electrochemical plating solutions. One exemplary material that cap member 701 may be manufactured from is PEEK. Cap member 701 also includes a substrate centering post 703 extending upward from the upper surface of cap 704. The substrate centering post 703 is positioned radially outward from the central portion 702 or peak of cap 701. In this manner, when the substrate centering member 404 is rotated, the substrate centering post 703 pivots or rotates around the longitudinal axis of core 704, and as such, post 703 rotates or pivots about central portion 702. The substrate centering member 404 also includes a sleeve member 705 positioned radially outward of core 704. Sleeve 705 cooperatively engages cap 704 and core 704 to form a fluid seal, which prevents processing fluids from traveling through the bore containing core member 704 and damaging the substrate centering mechanism 600 positioned below.

Figure 7B:
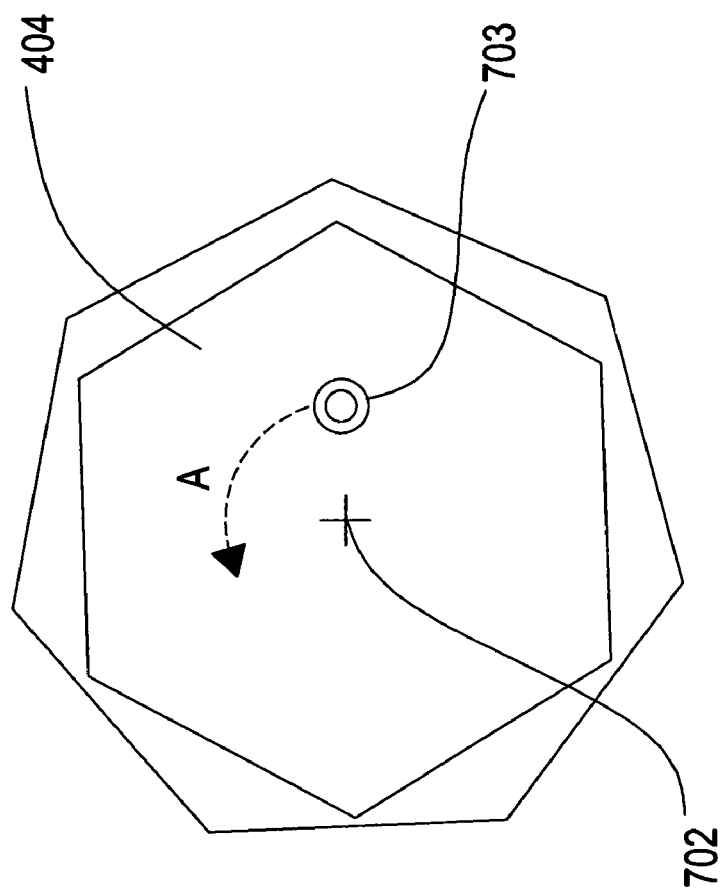
FIG. 7B illustrates a top view of an exemplary substrate centering member of the invention.

FIG. 7B illustrates a top view of an exemplary substrate centering member 404 of the invention, and more particularly, FIG. 7B illustrates a top view of the cap member 701 illustrated in FIG. 7A. FIG. 7B illustrates the positional relationship between the center portion 702 or peak of the center portion 702 and the substrate centering pin 703. Further, when centering member 494 is rotated about its' central axis, i.e., rotated about the axis that extends through point 702 by centering mechanism 600, then the substrate centering pin.703 is caused to move in the direction indicated by arrow A. This motion, which will be further discussed herein, may be used to urge a substrate positioned on members 404 to a central or center position.

In operation, the bevel cleaning cell of the invention can be used to rinse and clean substrates. The cleaning operation may be conducted on both the production surface and the non-production surface of the substrate, or on either surface individually. The cleaning cell of the invention may also be used to clean excess material from the bevel portion of the substrates, i.e., the portion of the seed layer deposited near the perimeter on the production surface, on the bevel, and partially onto the backside of the substrate. This process is often termed bevel clean or edge bead removal in the semiconductor art.

As noted above, generally, substrate processing system 100 will include plating cells positioned at locations 102, 104, 110, and 112, spin rinse dry and cleaning cell stacked at locations 114 and 116, and bevel clean cells positioned at locations 106 and 108. Robots 122 and 124 operate to transfer substrates between the respective processing cells. Generally, substrates transferred to the bevel cleaning cell locations 106 and 108 are transferred thereto from one of plating cell locations 102, 104, 110, and 112, as the bevel clean cells are generally configured to remove material deposited on the double portion of the substrate, as well as the backside of the substrate, prior to the substrate being transferred out of system 100.

The process of positioning a substrate into the bevel cleaning cell 400 of the invention generally includes insertion, centering, and chucking. The insertion process is conducted by robots 122 and 124, and includes bringing the substrate into bevel cleaning cell 400 and lowering the substrate onto centering pins 404. When the substrate is lowered onto centering pins 404, the substrate is supported by the central peak or uppermost portion 702 of the respective centering pins 404. Once the substrate is positioned on the respective centering pins 404, the robot is retracted from bevel clean cell 400.

Once the substrate is inserted into bevel cleaning cell 400, the centering process is conducted. The centering of the substrate in the bevel clean cell 400 is crucial to the bevel clean process, as the tolerances for removing the edge bead material from the substrate are generally less than about 1 mm. For example, when copper is electrochemically deposited on to a semiconductor substrate, generally, the outer 3 to 5 mm perimeter of the substrate is not considered to be part of the production surface, i.e., devices are generally not formed in this outer perimeter or band, which is generally termed the exclusion zone. The exclusion zone includes an exposed portion of the seed layer where electrical contacts are generally positioned during the plating process.

The seed layer deposited on to the exclusion zone generally extends onto the bevel of the substrate, and sometimes onto the backside or not production surface of the substrate. Since subsequent semiconductor processing steps will generally include contact with either the double portion of the substrate or the backside of the substrate, it is desirable to remove or clean the double and backside of the substrate, so that subsequent contact with these areas will be less likely to generate contamination particles. The removal of the material from the exclusion zone, bevel, and backside of the substrate is generally termed a bevel clean process, and includes dispensing an etchant solution onto the interface between the production surface of the substrate and the exclusion zone, while also dispensing a cleaning solution onto the backside of the substrate. Therefore, since the etchant solution dispensed on to the front side of the substrate is dispensed at the interface between the production surface and exclusion zone, it is critical that the substrate be properly centered, so that the etchant will not be dispensed onto the production surface and damage devices.

The centering process begins by activating the frictionless actuator 601, which gently rotates each of receptacles 606. The substrate centering posts 404 received in receptacles 606 are cooperatively rotated, and therefore, substrate centering pins 703 positioned on cap member 701 rotated inwardly and cooperatively engage the edge of the substrate. This cooperative rotational movement of pins 703 causes the substrate to be centered between the respective posts 404. Once the substrate is centered between the respective posts 404, a gentle tensioning force may be maintained on the substrate by posts 404 via continued application of actuation pressured to frictionless cylinders 601. However, the tensioning force is calculated to be enough force to maintain the substrate in the center position, while being an insufficient force to cause blowing or deflection of the substrate surface.

Once the substrate is centered, it may be then chucked to the substrate support member 403. The chucking process generally includes either raising chuck 403 to engage the lower surface of the substrate secured to the centering posts 404, or lowering the centering posts 404 to position the substrate on chuck 403, or a combination of raising chuck 403 and lowering posts 404. Chuck 403 can be a vacuum-type chuck, and therefore, when the substrate and chuck 403 are brought into physical contact with each other, or close thereto, a reduced pressure may be generated at the surface of chuck 403 to secure the substrate thereto. Once the substrate is secured to chuck 403, pins 404 may be lowered or chuck 403 may be raised, so that the substrate is supported solely by chuck 403.

With the substrate chucked and secured, fluid processing may begin. The fluid processing generally includes pivoting the rinsing solution arm 405 to a position approximately above the center of the substrate. The rinsing solution may then be dispensed therefrom while the substrate is rotated on the chuck 403. The rotation causes the rinsing solution, which may be DI water, for example, to be urged radially outward toward the perimeter of the substrate. The rinsing solution flows over the bevel edge of the substrate and falls onto drain basin 402, where it may be collected by a drain (not shown). A chemical dispensing arm 406 may also be positioned above the substrate, more particularly, the chemical dispensing arm 406 may be specifically positioned such that an etchant solution may be dispensed therefrom onto the interface between the production surface and the exclusion zone of the substrate. The process of dispensing the etchant solution onto the interface generally includes terminating the dispensing of the rinsing solution from arm 405, and initiating the dispensing of the etchant solution from arm 406. This methodology allows the rinsing solution previously dispensed onto the production surface to maintain a barrier or shield layer on the production surface, which may act to dilute any etchant that may splash back onto the production surface. Further, termination of the rinsing solution dispensing process prior to dispensing the etchant and arso operates to prevent unwanted dilution of the etchant solution.

Similarly, the backside fluid dispensing nozzle 500 may also be used to dispense a rinsing solution and an etchant solution onto the backside of the substrate. The backside fluid dispensing nozzle or manifold 500 generally includes a plurality of nozzles, which allows for the backside fluid dispensing nozzle 500 to dispense both a rinsing solution and an etchant solution. Thus, while the cleaning and rinsing processes are being conducted on the front side of the substrate, backside nozzle 500 may simultaneously be used to rinse and clean the backside of the substrate.

An exemplary bevel cleaning process may include the first prerinsing both of the front and backside surfaces of the substrate. The prerinsing process may include dispensing DI onto the front side of the substrate at a flow rate of between about 1 L/min and about 2 L/min and dispensing DI onto the backside of the substrate at a flow rate of between about 50 cc/min and 100 cc/min. During this process, the substrate may be rotated between about 150 rpm and about 250 rpm, and the duration for the fluid dispensing processes may be between about eight seconds and about 20 seconds. Generally, the prerinsing process is configured to rinse off any residual electrolyte that may be adhering to the substrate surface as a result of the previous electrochemical plating process. Once the substrate is prerinsed, the rotation speed may be increased to between about 2000 rpm and about 3500 rpm for about five seconds in order to remove any DI buildup near the edge of the substrate. Thereafter, while the substrate is still rotating at between about 2000 rpm and about 3500 rpm, the etchant solution may be applied to the interface between the production surface and the exclusion zone by arm 406, for example. The etchant solution may be delivered to the interface at a flow rate of between about 20 cc/min and about 40 cc/min, for example, and the duration may be between about 10 seconds and about 25 seconds. The flow of etchant solution is generally though a relatively fine nozzle having an aperture with an inner diameter, for example, of between 0.25 and 0.5 inches. The rotation rate is maintained at the high rate in order to minimize staining of the production surface as a result of any splashing of the etchant solution inwardly onto the production surface. Generally, the nozzle that dispenses the etchant solution onto the substrate is positioned between about 1 mm and about 3 mm from the substrate surface to allow for precise dispensing of the etchant solution onto the interface. Further, the nozzle is generally angled at between about 30° and about 50°, i.e., angled toward the substrate perimeter, to minimize splash back onto the production surface.

The chemical makeup of the etchant solution is generally based on $H_2SO_4$, and therefore, when the concentration of $H_2SO_4$ is sufficient, the etch rate does not change at a fixed $H_2O_2$ concentration. Similarly, when the $H_2SO_4$ concentration is insufficient, the etch rises with $H_2SO_4$ non-linearly. Further, when $H_2SO_4$ concentration is sufficient, the etch changes linearly with $H_2O_2$ concentration, and when the $H_2SO_4$ concentration is insufficient, the etch rate flattens due to diffusion limited oxidation. Therefore, an exemplary ratio of constituents in an etching solution is between about 15 and 25 parts $H_2SO_4$, between about 350 and 450 parts $H_2O_2$, and over 1400 parts $H_2O$, or about 20 parts $H_2SO_4$, 400 parts $H_2O_2$, and 1580 parts $H_2O$, for example. These concentrations indicate that increasing the acid concentration increases the etch rate, while the peroxide concentration has a minimal effect on the etch rate when increased. Further, when $H_2O_2$ concentration is less than 6%, oxidation of copper has shown to be slow, and therefore, at these concentrations the etch rate is generally not effected by the $H_2SO_4$ concentration. However, when $H_2O_2$ concentration is greater than 6%, copper oxidation is increased, and therefore, the etch rate of high concentration $H_2SO_4$ rises with $H_2O_2$ concentrations.

When the duration of the etchant solution dispensing process is completed, a rinsing solution may once again be dispensed onto the production surface at a flow rate of between about 1 L/min and about 2.5 L/min for between about 3 seconds and about 10 seconds, while the rotation rate may be reduced to between about 100 rpm and about 300 rpm. The step of dispensing a rinsing solution onto the production surface of the substrate may serve two purposes. First, the rinsing solution dispensed after the etchant solution operates to dilute and rinse away any splashed etchant solution from the production surface. Second, the rinsing solution also forms a secondary protection layer to protect from etching solution that may splash from the subsequent backside chemical dispensing step. When the dispensing process for the front side rinsing solution is completed, the backside chemical nozzle may be activated to dispense an etchant solution onto the backside of the substrate at a flow rate of between about 30 cc/min and about 70 cc/min for between about 4 seconds and about 10 seconds, while the rotation rate of the substrate is maintain to between about 150 rpm and about 250 rpm. More particularly, the flow rate of the etchant may be between about 35 cc/min and 45 cc/min. Higher flow rates have been shown to generate improved edge profile and bevel cleaning, however, these advantages are tempered by increased edge staining. When the backside chemical dispensing step is completed, another front side rinsing step may be conducted to rinse any splashed etchant from the front side surface. The front side rinsing process may again include dispensing DI at the previous flow rates and rotation rates for a duration of between about two seconds and about six seconds. When the final rinsing process is completed, all fluid dispensing nozzles may be turned off and the rotation rate of the substrate may be increased to between about 400 rpm and about 4000 rpm, generally between about 2000 rpm and 3000 rpm, to partially or completely dry the substrate.

While the foregoing is directed to embodiments of the present invention, other and further embodiments of the invention may be devised without departing from the basic scope thereof, and the scope thereof is determined by the claims that follow.

The invention claimed is:
1. A substrate bevel cleaning chamber, comprising:
a chamber body defining a processing volume;
a rotatable substrate support member positioned in a lower portion of the processing volume;
at least three cooperatively rotatable substrate centering posts radially positioned around the rotatable substrate support member such that the posts remain stationary during rotation of the substrate support member, wherein each of the cooperatively rotatable centering posts comprise:
a vertical shaft member rotatable about its central axis;

a cap member positioned on a distal terminating end of the shaft member;

a sleeve member engaged with the vertical shaft member and the cap member to form a fluid seal;

a raised central substrate support portion positioned at a rotational center of the cap member, wherein the rotational center of the cap member is substantially aligned with the central axis of the shaft member; and a substrate centering member extending upwardly from the cap member and being positioned away from the rotational center of the cap member; and a fluid dispensing nozzle movably positioned to dispense a cleaning fluid onto the top surface of a substrate positioned on the substrate support member.

2. The cleaning chamber of claim 1, further comprising a substrate centering actuation mechanism, comprising:

at least three rotatable centering post receiving receptacles;

a linkage assembly connecting each of the at least three rotatable centering post receiving receptacles; and a reduced friction actuator in communication with the linkage.

3. The cleaning chamber of claim 2, wherein the linkage assembly is configured to cooperatively rotate the at least three centering post receiving receptacles.

4. The cleaning chamber of claim 2, comprising a backside fluid dispensing nozzle.

5. The cleaning chamber of claim 4, wherein the backside fluid dispensing nozzle comprises a cleaning solution dispensing nozzle and a rinsing solution dispensing nozzle.

6. The cleaning chamber of claim 1, wherein the fluid dispensing nozzle comprises a first pivotally mounted fluid dispensing nozzle in fluid communication with an etchant solution source and a second fluid dispensing nozzle in fluid communication with a rinsing solution source.

7. The cleaning chamber of claim 1, wherein the cooperatively rotatable substrate centering posts are in communication with an actuator mechanism configured to simultaneously rotate each of the centering posts.

8. The cleaning chamber of claim 1, wherein the substrate centering posts are vertically movable between a loading position and a processing position.

* * * * *

UNITED STATES PATENT AND TRADEMARK OFFICE
CERTIFICATE OF CORRECTION

| | | |
|---|---|---|
| PATENT NO. | : 7,520,939 B2 | Page 1 of 1 |
| APPLICATION NO. | : 10/826492 | |
| DATED | : April 21, 2009 | |
| INVENTOR(S) | : Ho et al. | |

It is certified that error appears in the above-identified patent and that said Letters Patent is hereby corrected as shown below:

Column 13, Line 11, please delete "arso" and insert --also-- therefor.

Signed and Sealed this

Twenty-eighth Day of July, 2009

JOHN DOLL
*Acting Director of the United States Patent and Trademark Office*